United States Patent
Morishita et al.

(10) Patent No.: US 8,456,076 B2
(45) Date of Patent: Jun. 4, 2013

(54) ELECTRON EMITTING SOURCE AND MANUFACTURING METHOD OF ELECTRON EMITTING SOURCE

(75) Inventors: Toshiyuki Morishita, Shibukawa (JP); Yoshinori Terui, Shibukawa (JP)

(73) Assignee: Denki Kagaku Kogyo Kabushiki Kaisha, Tokyo (JP)

(*) Notice: Subject to any disclaimer, the term of this patent is extended or adjusted under 35 U.S.C. 154(b) by 2 days.

(21) Appl. No.: 12/745,316

(22) PCT Filed: Jul. 11, 2008

(86) PCT No.: PCT/JP2008/062590
§ 371 (c)(1),
(2), (4) Date: May 28, 2010

(87) PCT Pub. No.: WO2009/069335
PCT Pub. Date: Jun. 4, 2009

(65) Prior Publication Data
US 2010/0301736 A1   Dec. 2, 2010

(30) Foreign Application Priority Data
Nov. 30, 2007 (JP) .................. 2007-309726

(51) Int. Cl.
*H01J 1/15* (2006.01)
*H01J 19/08* (2006.01)
*H01K 1/02* (2006.01)

(52) U.S. Cl.
USPC .............. 313/341; 445/50; 313/336; 313/311

(58) Field of Classification Search
USPC .............. 445/50, 51; 313/311, 310, 341, 336, 313/346 R, 337
See application file for complete search history.

(56) References Cited

U.S. PATENT DOCUMENTS

| | | | | |
|---|---|---|---|---|
| 3,312,856 A | * | 4/1967 | Grams et al. | 313/346 R |
| 3,532,923 A | | 10/1970 | Vogel | |
| 3,833,494 A | * | 9/1974 | Van Stratum et al. | 204/484 |
| 4,482,839 A | * | 11/1984 | Wada et al. | 313/346 R |
| 4,528,474 A | | 7/1985 | Kim | |
| 4,760,306 A | * | 7/1988 | Leung et al. | 313/341 |
| 4,843,277 A | * | 6/1989 | Winkler et al. | 313/346 R |

(Continued)

FOREIGN PATENT DOCUMENTS

| | | |
|---|---|---|
| GB | 2038541 | 7/1980 |
| JP | 47-25911 | 7/1972 |

(Continued)

OTHER PUBLICATIONS

Search Report issued in International Patent Application No. PCT/JP2008/062590 on Sep. 22, 2008.

(Continued)

*Primary Examiner* — Mariceli Santiago
*Assistant Examiner* — Glenn Zimmerman
(74) *Attorney, Agent, or Firm* — Stein IP, LLC

(57) ABSTRACT

An electron emitting source capable of preventing increase in an inter-terminal resistance and a manufacturing method of the electron emitting source. The electron emitting source comprises an electron emitting chip made of rare-earth hexaboride, and a heater constituted by a carbonaceous member for holding and heating the electron emitting chip, wherein an electrically conductive substance is provided in a gap between the electron emitting chip and the heater.

3 Claims, 3 Drawing Sheets

U.S. PATENT DOCUMENTS

| | | | | |
|---|---|---|---|---|
| 4,878,866 | A | * | 11/1989 | Mori et al. .................. 445/36 |
| 6,903,499 | B2 | * | 6/2005 | Terui et al. .................. 313/309 |
| 2002/0024280 | A1 | * | 2/2002 | Miyamoto et al. ........ 313/346 R |

FOREIGN PATENT DOCUMENTS

| | | |
|---|---|---|
| JP | 57-63744 | 4/1982 |
| JP | 60-23456 | 6/1985 |
| JP | 62-140331 | 6/1987 |
| JP | 63-2222 | 1/1988 |
| JP | 3-105833 | 5/1991 |
| JP | 6-76730 | 3/1994 |
| JP | 7-335161 | 12/1995 |
| JP | 2000-58448 | 2/2000 |
| JP | 2005-190758 | 7/2005 |
| WO | WO 2007055154 A1 * | 5/2007 |

OTHER PUBLICATIONS

European Search Report dated Dec. 6, 2011, issued in corresponding European Patent Application No. 08778105.0-2208 / 2216797 PCT/JP2008062590.

* cited by examiner

ELECTRON EMITTING SOURCE AND MANUFACTURING METHOD OF ELECTRON EMITTING SOURCE

CROSS-REFERENCE TO RELATED APPLICATIONS

This application claims the benefit of PCT International Patent Application No. PCT/JP2008/062590, filed Jul. 11, 2008, and Japanese Patent Application No. 2007-309726, filed Nov. 30, 2007, in the Japanese Patent Office, the disclosures of which are incorporated herein by reference.

BACKGROUND OF THE INVENTION

1. Field of the Invention

The present invention relates to an electron emitting source such as a thermionic cathode using lanthanum hexaboride or cerium hexaboride monocrystals used in electron microscopes, critical dimension scanning electron microscopes and electron beam exposure apparatus, and a method of manufacturing such an electron emitting source.

2. Description of the Related Art

An example of an electron emitting source used in equipment applying electron beams such as electron beam lithography apparatus and electron microscopes is one using an element functioning as an electrically heatable heater of highly crystalline carbon or the like, an electron emitting source tip (hereinafter referred to simply as a "tip") composed of a rare earth hexaboride that radiates electrons sandwiched by the aforementioned heater, and an electrically conductive support holding the aforementioned tip together with the heater (see Patent Document 1).

More specifically, as shown for example in FIG. 1, terminals (2a and 2b) and electrically conductive supports 3 are attached to an insulator 1, at the ends thereof, the supports 3 sandwich a tip 4 for emitting electrons and heaters 5 in the form of rectangular solids positioned at both side surfaces of the tip 4, and thereby hold the tip 4 and heaters 5. LaB6 or the like can be used as the material of the electron emitting source tip 4.

The heater may be an element of a carbonaceous material such as so-called hot press carbon (see Patent Document 1) which is obtained by hot-pressing a furan resin or the like, or a thermolytic carbon (see Patent Document 2). The above elements have anisotropic volume resistivity, and are usually shaped in the form of a rectangular solid, which is sandwiched by the electrically conductive supports 3 such as to allow passage of electricity in the direction of high volume resistivity.

Patent Document 1: JP-B S60-23456
Patent Document 2: JP S47-25911

With the electron emitting source shown in FIG. 1, by passing a DC current through the terminals (2a and 2b) in a high vacuum, the tip 4 can be heated to a predetermined temperature by the heaters 5, and by further placing the tip 4 in an electric field, electrons can be extracted from the tip 4, enabling it to be used as an electron emitting source in electron beam lithography apparatus or electron microscopes.

Normally, when using LaB6 or the like as the electron emitting source tip 4, it is heated to 1400-1500° C.

SUMMARY OF THE INVENTION

As described above, electron emitting sources are usually used by heating them, but when using a rare earth hexaboride such as LaB6 as the electron emitting tip 4 and using a carbonaceous element as the heater, the resistance between the terminals (2a and 2b) can rise considerably depending on the storage time and conditions before use, as a result of which they can become impossible to electrically heat at the time of use. The reason for this seems to be that an insulating substance is formed as a product of hydrolysis of the electron emitting source tip 4 between the tip 4 and the heater 5.

The purpose of the present invention is to suppress increases in inter-terminal resistance as described above, to offer a stable and electrically heatable charged particle source.

The electron emitting source of the present invention is an electron emitting source comprising an electron emitting source tip composed of a rare earth hexaboride; and a heater composed of a carbonaceous member for holding and heating the electron emitting source tip, characterized in that an electrically conductive substance is provided between the electron emitting source tip and the heater.

With the electron emitting source having the above-described structure, an electrically conductive substance is provided between the electron emitting source tip and the heater composed of a carbonaceous member, thereby suppressing reaction products generated by hydrolysis between the electron emitting source tip and the moisture in the gaseous phase, and preventing the increases in inter-terminal resistance occurring in conventionally known electron emitting sources.

The electron emitting source of the present invention is capable of preventing the increases in inter-terminal resistance occurring in conventionally known electron emitting sources.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

Figure 1:
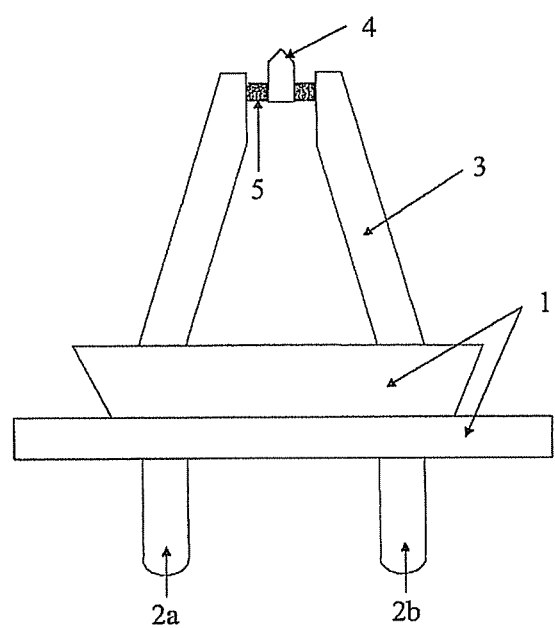
FIG. 1 is a schematic view of a conventionally known electron emitting source.

DESCRIPTION OF THE REFERENCE NUMBERS 1 insulator
2a, 2b terminal
3 electrically conductive support
4 electron emitting source tip
5 heater
6 carbon paste
7 rhenium layer

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

History of the Invention

The present inventors performed various analyses in view of the situation in the conventional art, as a result of which they discovered that the above problems can be solved by, between the hexaboride and the heater composed of a carbonaceous member, covering the surface on the electron emitting source tip side with an electrically conductive substance, thereby resulting in the present invention.

Herebelow, examples of the present invention shall be explained with reference to FIG. 2 and FIG. 3, as Embodiment 1 and Embodiment 2.

Embodiment 1

Figure 2:
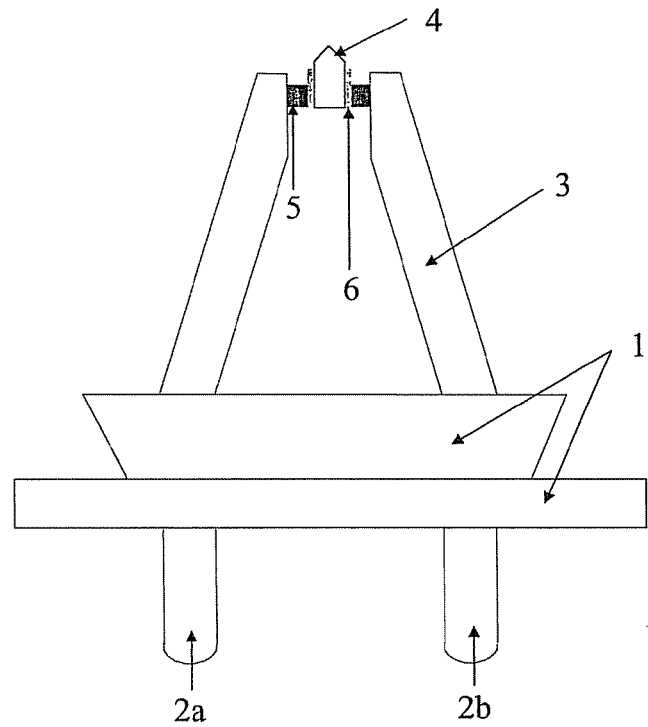
FIG. 2 is a schematic view of an electron emitting source according to Embodiment 1 of the present invention.

In the example of the present invention shown in FIG. 2, a carbon paste 6 is applied so as to fill the gap between the electron emitting source tip 4 and the heater 5. Colloidal graphite (aqueous colloidal graphite) was chosen for use as this carbon paste 6.

By using such a electrically conductive paste, it can be easily applied to the surface of the electron emitting source tip.

In the electron emitting source of the present invention as shown in FIG. 2, it is preferable to use a carbon paste as the main component of the substance for filling the gap, since it is easy to apply to the surface of the electron emitting source tip. However, there are no limitations on the substance, as long as the substance is not susceptible to reactions with an electron emitting source tip composed of a rare earth hexaboride and is capable of filling the gap between the electron emitting source tip and the heater 5.

Due to the above structure, the portions of contact between the electron emitting source tip 4 composed of a rare earth hexaboride such as LaB6 and the gaseous phase can be eliminated, thereby suppressing the generation of reaction products at the boundary between the electron emitting source tip 4 and the heater 5 as seen in conventional electron emitting sources.

As substances that can be used aside from carbon, there are high melting point metals such as rhenium, as well as boron carbide, zirconium boride and the like, which are desirable for being boron compounds like LaB6.

Embodiment 2

Figure 3:
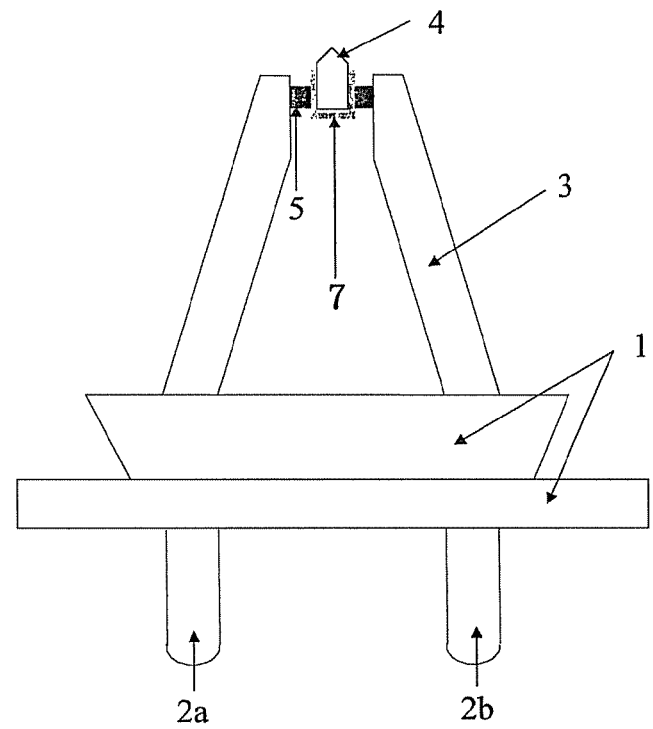
FIG. 3 is a schematic view of an electron emitting source according to Embodiment 2 of the present invention.

In the example of the present invention shown in FIG. 3, a rhenium layer 7 is provided between the electron emitting source tip 4 and the heater 5.

The example of the electron emitting source of the present invention shown in FIG. 3 has a rhenium layer 7 in the form of a foil on the surface of the electron emitting tip 4 side. In other words, the electrically conductive substance may be in the form of a foil as long as the substance is not susceptible to reactions with the electron emitting source tip and the surface of the electron emitting source tip 4 side of the gap between the electron emitting source tip 4 and the heater 5 is isolated from the gaseous phase.

As shown in FIG. 3, in the electron emitting source of the present invention, the rhenium layer 7 is in the shape of a square U (or a U-shaped trough). However, it is not limited to this structure, as long as the surface on the electron emitting source tip 4 side of the gap between the electron emitting source tip 4 and the heater 5 is covered by the rhenium layer 7.

The thickness of the rhenium layer 7 should be from 5 microns to 0.1 mm or less, due to spatial restrictions and power consumption when heating the electron emitting source tip 4.

Due to the above structure, the portions of contact between the electron emitting source tip 4 composed of a rare earth hexaboride such as LaB6 and the gaseous phase can be eliminated, thereby suppressing the generation of reaction products at the boundary between the electron emitting source tip 4 and the heater 5 as seen in conventional electron emitting sources.

Functions and Effects

Herebelow, the functions and effects of the electron emitting sources according to the above-described Embodiments 1 and 2 shall be explained.

The electron emitting sources of Embodiments 1 and 2 are electron emitting sources comprising an electron emitting source tip 4 composed of a rare earth hexaboride and a heater 5 composed of a carbonaceous member for holding and heating the electron emitting source tip 4, wherein an electrically conductive substance (reference number 6 in FIG. 2 and reference number 7 in FIG. 3) is provided in the gap between the electron emitting tip source 4 and the heater 5.

The above-described electron emitting source can prevent increases in inter-terminal resistance which occur in conventionally known electron emitting sources.

The electrically conductive substance may be an electrically conductive substance comprising one or more substances chosen from the group consisting of carbon, boron carbide and zirconium boride. This enables the electron emitting source to be obtained at low cost.

Additionally, the main component of the electrically conductive substance may be carbon. As a result, an electron emitting source of stable quality can be obtained.

Additionally, the electrically conductive substance may be an electrically conductive substance containing rhenium. As a result, an electron emitting source that suppresses increases in inter-terminal resistance can be obtained.

The electron emitting sources of Embodiments 1 and 2 can be obtained by a method of manufacturing an electron emitting source comprising an electron emitting source tip 4 composed of a rare earth hexaboride and a heater composed of a carbonaceous member for holding and heating the electron emitting source tip 4, the method of manufacturing an electron emitting source being characterized by comprising a step of providing an electrically conductive substance in the gap between the electron emitting source tip 4 and the heater 5.

Due to this manufacturing method, it is possible to obtain an electron emitting source capable of preventing increases in inter-terminal resistance.

The step of providing an electrically conductive substance in the gap between the electron emitting source tip 4 and the heater 5 may include a step of applying a carbon paste to the surface of the electron emitting source tip 4. Due to this manufacturing method, an electron emitting source of stable quality can be obtained at a lower cost.

While the electron emitting source and electron emitting source manufacturing method of the present invention were explained by providing the examples of Embodiment 1 and Embodiment 2, the present invention is not limited to the above.

EXAMPLES

Herebelow, the electron emitting source and electron emitting source manufacturing method of the present invention shall be explained in further detail by providing working examples and comparative examples, but these are not to be construed as limiting the present invention.

Example 1

First, as the material of the electron emitting tip 4, LaB6 monocrystals were cut in the form of a rectangular column with dimensions of 0.6 mm×0.75 mm×2 mm, with the longest direction aligned with the <100> crystal orientation, and one end with a 0.6 mm×0.75 mm surface was shaped into a 90° cone, with the vertex of the cone being shaped into a sphere having a radius of 15 microns.

Additionally, as the heater 5, a thermolytic carbon was cut out to a size of 0.75 mm×0.75 mm×0.68 mm.

Additionally, in Example 1, a carbon paste 6 (Oukenshoji Co., Ltd; product name "Colloidal Graphite") was applied to the electron emitting source tip 4 as shown in FIG. 2. In this case, the area of application of the carbon paste 6 was at least about the same as the contact area of the heaters 5. Then, the terminals (2a and 2b) and the electrically conductive supports 3 were attached to the insulator 1, an electron emitting source tip 4 to which a carbon paste 6 has been applied and heaters 5 were sandwiched between the ends of the supports 3, so as to hold the electron emitting tip 4 and heaters 5, thereby resulting in an electron emitting source.

Example 2

In Example 2, as shown in FIG. 3, a rhenium foil (product of The Nilaco Corporation) with a thickness of 25 microns and a width of 0.75 mm was folded into the shape of a square U, and placed between the electron emitting source tip 4 and the heaters 5 positioned on the side surfaces thereof. Then, the terminals (2a and 2b) and the electrically conductive supports 3 were attached to the insulator 1, an electron emitting source tip 4 intermediated by a rhenium foil 7 and heaters 5 were sandwiched between the ends of the supports 3, so as to hold the electron emitting tip 4 and heaters 5, thereby resulting in an electron emitting source.

Comparative Example

In the Comparative Example, as shown in FIG. 1, the terminals (2a and 2b) and the electrically conductive supports 3 were attached to the insulator 1, an electron emitting source tip 4 and heaters 5 in the form of rectangular solids provided on both side surfaces of the tip 4 were sandwiched between the ends of the supports 3, so as to hold the electron emitting tip 4 and heaters 5, thereby resulting in an electron emitting source.

(Measurement of Inter-terminal Resistance)

The inter-terminal resistances at room temperature of the electron emitting sources according to Examples 1, 2 and the Comparative Example were measured with a tester (product of Hioki E. E. Corporation) having a measurement precision of 0.01 ohms, then they were placed in an isothermic isobaric tank set to a temperature of 80° C. and a high humidity of 80% relative humidity in order to accelerate the insulation forming reaction.

After placement in the isothermic isobaric tank, the electron emitting sources of the examples and the comparative example were extracted from the isothermic isobaric tank after the passage of some time, to measure the inter-terminal resistance. This operation was repeated.

Then, the rate of increase in inter-terminal resistance with the elapsed time was determined using the inter-terminal resistance before placement in the isothermic isobaric tank as a standard. The results of computation of this rate of increase are shown in FIG. 4.

Figure 4:
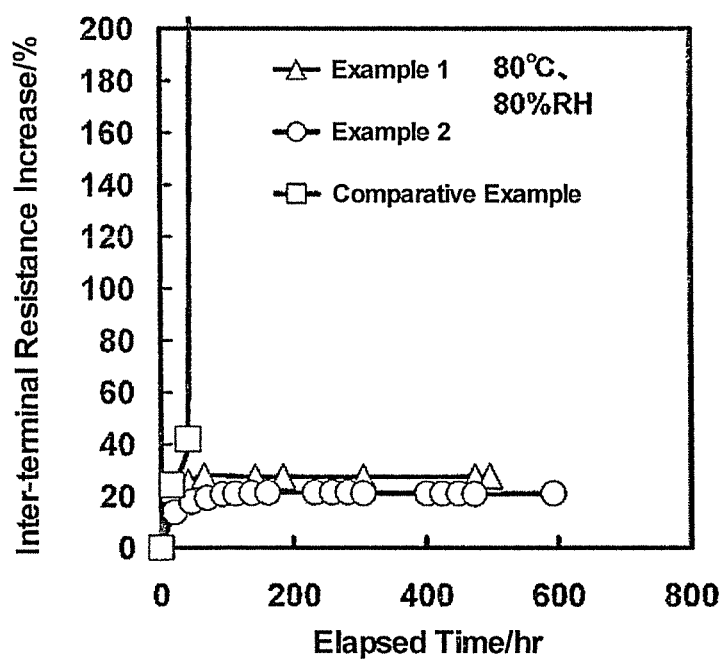
FIG. 4 is a diagram showing the change in increase in inter-terminal resistance over elapsed time for Embodiment 1, Embodiment 2 and a Comparative Example.

As shown in FIG. 4, with the electron emitting sources of Examples 1 and 2, the rate of increase after about 500 hours was less than 30%. On the other hand, with the electron emitting sources, the rate of increase suddenly increased, reaching more than 200%.

Thus, the electron emitting source of the present invention is such that the inter-terminal resistance is not susceptible to increases even in high-temperature, high-humidity environments.

Although a few embodiments of the present invention have been shown and described, it would be appreciated by those skilled in the art that changes may be made in this embodiment without departing from the principles and spirit of the invention, the scope of which is defined in the claims and their equivalents.

INDUSTRIAL APPLICABILITY

The electron emitting source of the present invention has the effect of being capable of suppressing increases in inter-terminal resistance that occur depending on the storage time and conditions before use, thus being effective in improving the quality of electron emitting sources, which is extremely useful to industry.

The invention claimed is:

1. An electron emitting source comprising an electron emitting source tip composed of a rare earth hexaboride; and a heater composed of a carbonaceous member for holding and heating said electron emitting tip,
    characterized in that an electrically conducting substance which suppresses formation of hydrolysis product of said rare earth hexaboride is provided in a gap between said electron emitting source tip and the heater, the electrically conducting substance is a rhenium foil with a thickness in a range of 5 μm to less than 50 μm, the rhenium foil is in the shape of a square U, and the rhenium foil directly contacts the rare earth hexaboride.

2. A method of manufacturing an electron emitting source comprising an electron emitting source tip composed of a rare earth hexaboride and a heater composed of a carbonaceous member for holding and heating said electron emitting source tip, the method of manufacturing and electron emitting source being characterized by comprising a step of providing an electrically conductive substance which suppresses hydrolysis reaction of said rare earth hexaboride in a gap between said electron emitting source tip and the heater, wherein the electrically conducting substance is a rhenium foil with a thickness in a range of 5 μm to less than 50 m, the rhenium foil is in the shape of a square U, and the rhenium foil directly contacts the rare earth hexaboride.

3. A method of manufacturing an electron emitting source in accordance with claim 2, wherein the step of providing an electrically conductive substance in the gap between said electron emitting source tip and the heater comprises the step of folding the rhenium foil for covering the bottom and a part of side walls of the electron emitting source tip and the step of providing the electrically conducting substance between the gap is applying the folded rhenium foil in said gap.

* * * * *